United States Patent
Wang et al.

(10) Patent No.: US 7,812,638 B2
(45) Date of Patent: Oct. 12, 2010

(54) INPUT OUTPUT DEVICE FOR MIXED-VOLTAGE TOLERANT

(75) Inventors: Chua-Chin Wang, Kaohsiung (TW); Tzung-Je Lee, Kaohsiung (TW); Kuo-Chan Huang, Tainan County (TW); Tie-Yan Chang, Kaohsiung (TW)

(73) Assignees: National Sun Yat-Sen University, Kaohsiung (TW); Himax Technologies Limited, Sinshih Township, Tainan County (TW)

( * ) Notice: Subject to any disclaimer, the term of this patent is extended or adjusted under 35 U.S.C. 154(b) by 91 days.

(21) Appl. No.: 12/184,271

(22) Filed: Aug. 1, 2008

(65) Prior Publication Data

US 2009/0066367 A1    Mar. 12, 2009

Related U.S. Application Data

(60) Provisional application No. 60/970,267, filed on Sep. 6, 2007.

(51) Int. Cl.
    *H03K 19/0185* (2006.01)
(52) U.S. Cl. .............................. 326/83; 326/81; 326/86; 327/333
(58) Field of Classification Search .................. 326/81, 326/80, 83, 86; 327/333
    See application file for complete search history.

(56) References Cited

U.S. PATENT DOCUMENTS

| | | | | |
|---|---|---|---|---|
| 5,300,835 A | * | 4/1994 | Assar et al. .................... | 326/68 |
| 5,852,540 A | * | 12/1998 | Haider ........................ | 361/111 |
| 5,930,094 A | * | 7/1999 | Amerasekera et al. ......... | 361/56 |
| 6,208,167 B1 | * | 3/2001 | Ranjan et al. ................. | 326/81 |
| 6,252,422 B1 | * | 6/2001 | Patel et al. .................... | 326/80 |
| 6,255,851 B1 | * | 7/2001 | Strauss ........................ | 326/81 |
| 6,265,926 B1 | * | 7/2001 | Wong ........................ | 327/318 |
| 6,339,343 B1 | * | 1/2002 | Kim et al. ..................... | 326/83 |
| 6,351,358 B1 | * | 2/2002 | Allen .......................... | 361/90 |
| 6,369,613 B1 | * | 4/2002 | Costello et al. ............... | 326/83 |
| 6,388,469 B1 | * | 5/2002 | Hunt et al. .................... | 326/81 |
| 6,784,693 B2 | * | 8/2004 | Fan et al. ...................... | 326/81 |
| 7,504,861 B2 | * | 3/2009 | Chuang et al. ................ | 326/81 |
| 7,532,047 B2 | * | 5/2009 | Ker et al. ..................... | 327/108 |

\* cited by examiner

*Primary Examiner*—Vibol Tan
(74) *Attorney, Agent, or Firm*—Thomas, Kayden, Horstemeyer & Risley

(57) ABSTRACT

An input output device coupled between a core circuit and a pad and including an output cell, an input cell, and a pre-driver. The output cell includes an output stage and a voltage level converter. The output stage includes a first transistor and a second transistor connected to the first transistor in serial between a first supply voltage and a second voltage. The voltage level converter generates a first gate voltage to the first transistor according to the first voltage and a data signal. When the first supply voltage is increased, the first gate voltage is increased. When the data signal is at a high level, the first transistor is turned on. The input cell includes a pull unit and a first N-type transistor. The pre-driver turns off the first and the second transistors.

16 Claims, 8 Drawing Sheets

US 7,812,638 B2

INPUT OUTPUT DEVICE FOR MIXED-VOLTAGE TOLERANT

CROSS REFERENCE TO RELATED APPLICATIONS

This application claims the benefit of U.S. Provisional Application No. 60/970,267, filed on Sep. 6, 2007.

BACKGROUND OF THE INVENTION

1. Field of the Invention

The invention relates to an input output device, and more particularly to an input output device for mixed-voltage tolerant.

2. Description of the Related Art

With the development of technology, integrated circuits (ICs) are widely used electronic products. Each of the ICs comprises a large amount of transistors. To reduce the size and power consumption of the ICs, the thickness of the gate oxide of the transistors must been reduced. However, peripheral devices still require higher voltage (such as 5V). Thus, if transistors comprising the thin gate oxide receive the higher voltage, the gate oxide reliability of the transistors will not be maintained.

BRIEF SUMMARY OF THE INVENTION

Input cells are provided. An exemplary embodiment of an input cell coupled to a pad comprises an output stage and a voltage level converter. The output stage comprises a first transistor and a second transistor connected to the first transistor in serial between a first supply voltage and a second supply voltage. The voltage level converter generates a first gate voltage to the first transistor according to the first voltage and a data signal. Wherein when the first supply voltage is increased, the first gate voltage is increased. When the data signal is at a high level, the first transistor is turned on.

Output cells are also provided. An exemplary embodiment of an output cell coupled between a pad and a core circuit comprises a pull unit and a first N-type transistor. The pull unit is coupled to a node and receives an operation voltage. The first N-type transistor comprises a gate coupled to the pad, a source receiving a grounding voltage, and a drain coupled to the node.

Input output devices are also provided. An exemplary embodiment of an input output device coupled between a core circuit and a pad comprises an output cell, an input cell, and a pre-driver. The output cell comprises an output stage and a voltage level converter. The output stage comprises a first transistor and a second transistor. The first transistor connects to the second transistor in serial between a first supply voltage and a second supply voltage. The voltage level converter generates a first gate voltage to the first transistor according to the first voltage and a data signal. When the first supply voltage is increased, the first gate voltage is increased. When the data signal is at a high level, the first transistor is turned on. The input cell comprises a pull unit and a first N-type transistor. The pull unit is coupled to a node and receives an operation voltage. The first N-type transistor comprises a gate coupled to the pad, a source receiving a grounding voltage, and a drain coupled to the node. The pre-driver turns off the first and the second transistors.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
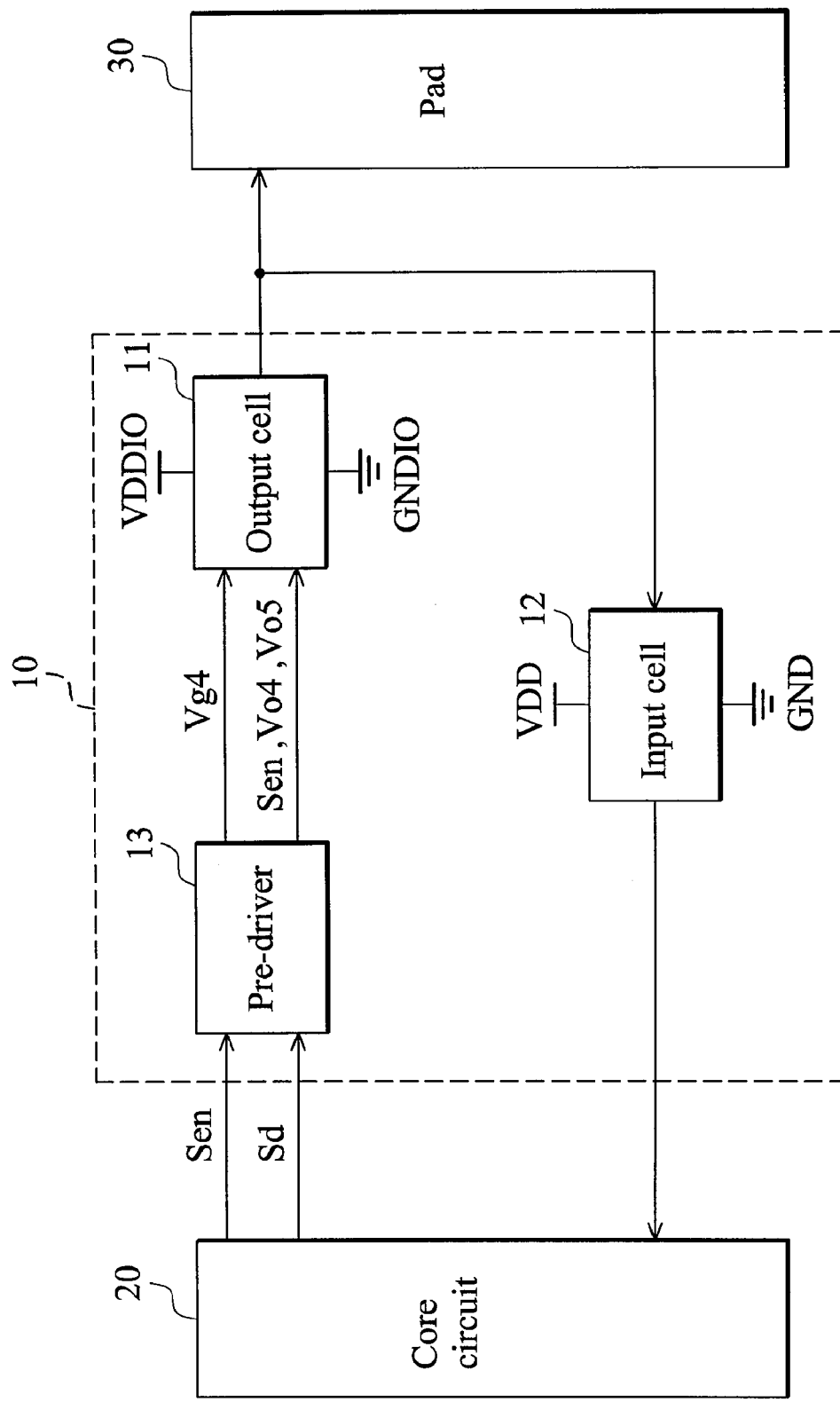
FIG. 1 is a schematic diagram of an exemplary embodiment of an input output device.

FIG. 1 is a schematic diagram of an exemplary embodiment of an input output device. The input output device 10 transmits data signal Sd provided by a core circuit 20 to a pad 30 or transmits the signal from the pad 30 to the core circuit 20. In this embodiment, the input output device 10 comprises an output cell 11, an input cell 12, and a pre-driver 13. The pre-driver 13 activates or de-activates the output cell according to a signal Sen.

When the output cell 11 is activated, the pad 30 can receive the data signal Sd provided from the core circuit 20. At this time, if the data signal Sd is at a low level (such as 0V), the level of the pad 30 approximately equals to that of supply voltage GNDIO. If the data signal Sd is at a high level (such as 3.3V), the level of the pad 30 approximately equals that of supply voltage VDDIO. The supply voltage VDDIO may be 5V, 3.3V, or 1.8V. The supply voltage GNDIO may be 0V.

When the output cell 11 is de-activated, the core circuit 20 utilizes the input cell 12 to receive the signal from the pad 30. At this time, if the pad 30 is at the low level, the signal received by the core circuit 20 approximately equals to a grounding voltage GND. If the pad 30 is at the high level, the signal received by the core circuit 20 approximately equals to an operation voltage VDD. The operation voltage VDD may be 3.3V. The grounding voltage GND may be 0V.

Figure 2:
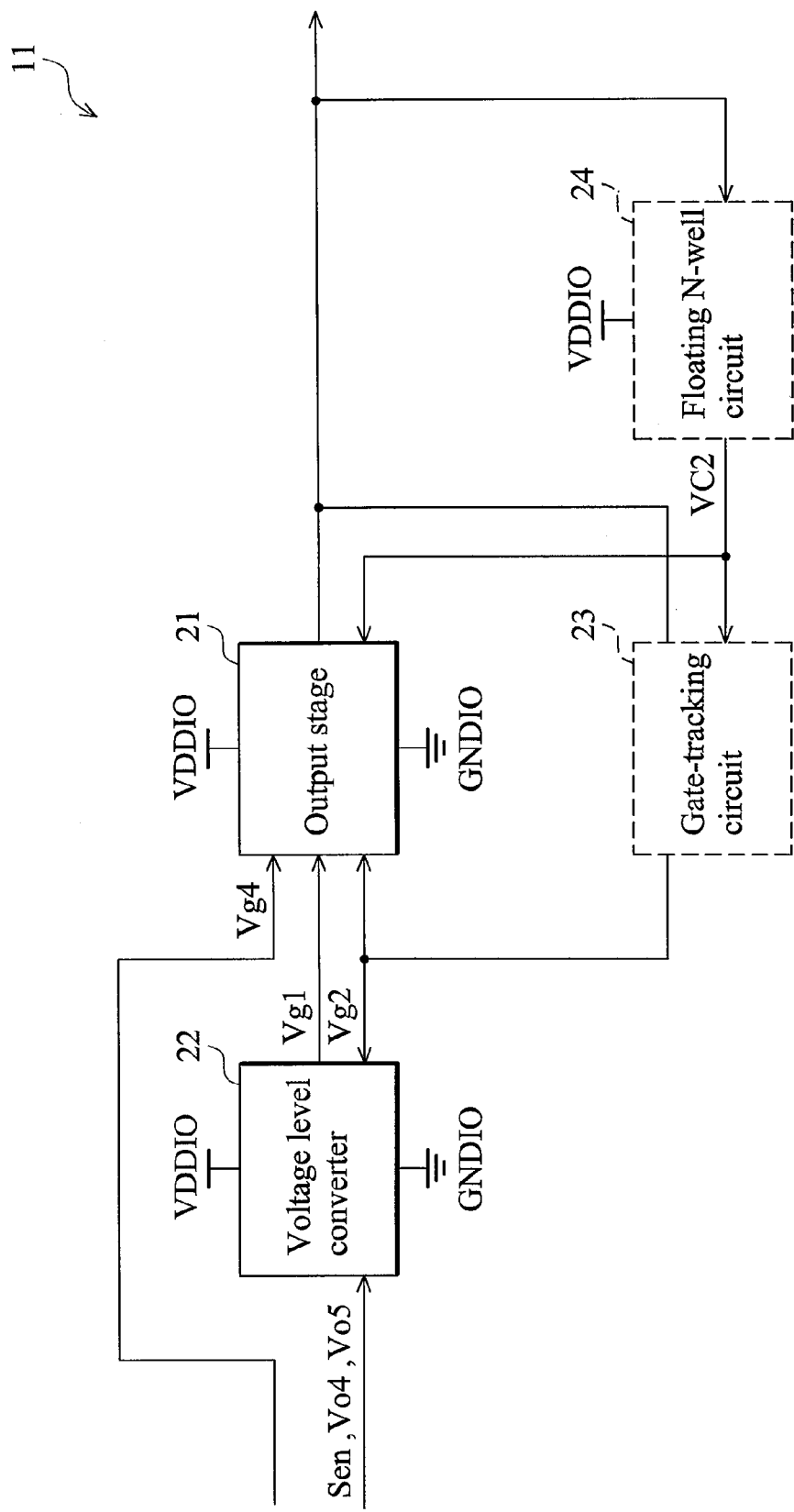
FIG. 2 is a schematic diagram of an exemplary embodiment of an output cell.

FIG. 2 is a schematic diagram of an exemplary embodiment of an output cell. The output cell 11 comprises an output stage 21 and a voltage level converter 22. The voltage level converter 22 generates appropriate gate voltage to the output stage 21 according to the supply voltage VDDIO. In this embodiment, the voltage level converter 22 generates two gate voltages (Vg1 and Vg2). In other embodiment, the voltage level converter 22 generates a single gate voltage or at least two gate voltages according to the structure of the output stage 21.

Figure 3A:
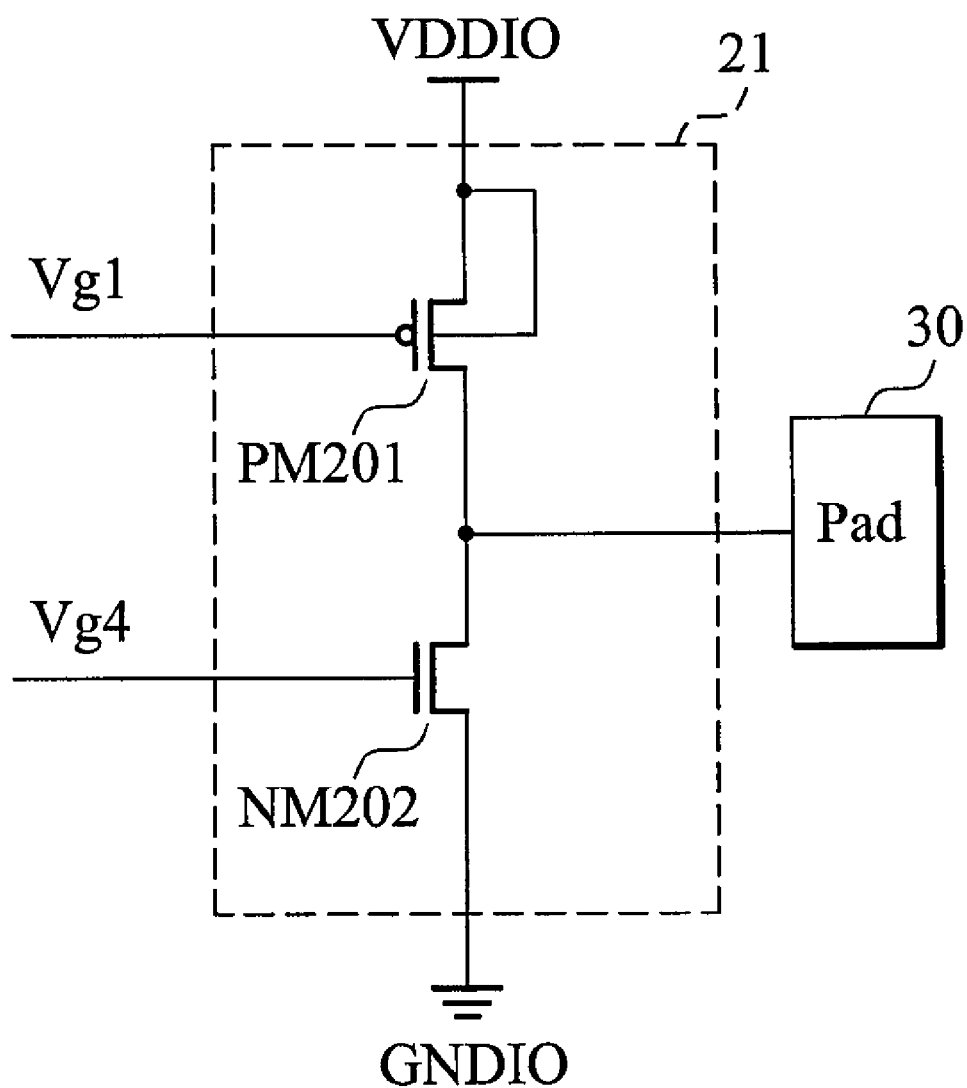
FIG. 3A is a schematic diagram of an exemplary embodiment of an output stage.

FIG. 3A is a schematic diagram of an exemplary embodiment of an output stage. The output stage 21 comprises transistors PM201 and NM202. The transistor PM201 comprises a gate receiving the gate voltage Vg1 generated by the voltage level converter 22, a source receiving the supply voltage VDDIO, a drain coupled to the pad 30, and a base receiving the supply voltage VDDIO. The supply voltage VDDIO may be 5V, 3.3V, or 1.8V. Because the voltage level converter 22 generates the appropriate gate voltage Vg1 according to the supply voltage VDDIO, the voltage difference between the gate and the source of the transistor PM201 is controlled.

For example, when the supply voltage VDDIO is increased to 5V, the voltage level converter 22 increases the gate voltage Vg1. When the supply voltage VDDIO is reduced to 3.3V or 1.8V, the voltage level converter 22 reduces the gate voltage Vg1. Since the gate voltage Vg1 is changed according to the supply voltage VDDIO, the voltage difference between the gate and the source of the transistor PM201 is less than a preset value. Thus, the gate oxide of the transistor PM201 is not damaged and the thickness of the gate oxide does not have to be increased due to the voltage level converter 22.

As shown in FIG. 3A, the transistor NM202 comprises a gate receiving gate voltage Vg4, a source receiving the supply voltage GNDIO, and a drain coupled to the pad 30. When the transistor PM201 is turned on, the voltage of the pad 30 equals to the supply voltage VDDIO. When the transistor NM202 is turned on, the voltage of the pad 30 equals to the supply voltage GNDIO. The supply voltage GNDIO is 0V.

In this embodiment, the gate voltage Vg4 is generated by the pre-driver 13 for turning on or off the transistor NM202. When the core circuit 20 desires to receive a signal from the pad 30, the pre-driver 13 turns off the transistor NM202. When the core circuit 20 desires to transmit at a low level to the pad 30, the pre-driver 13 turns on the transistor NM202.

Figure 3B:
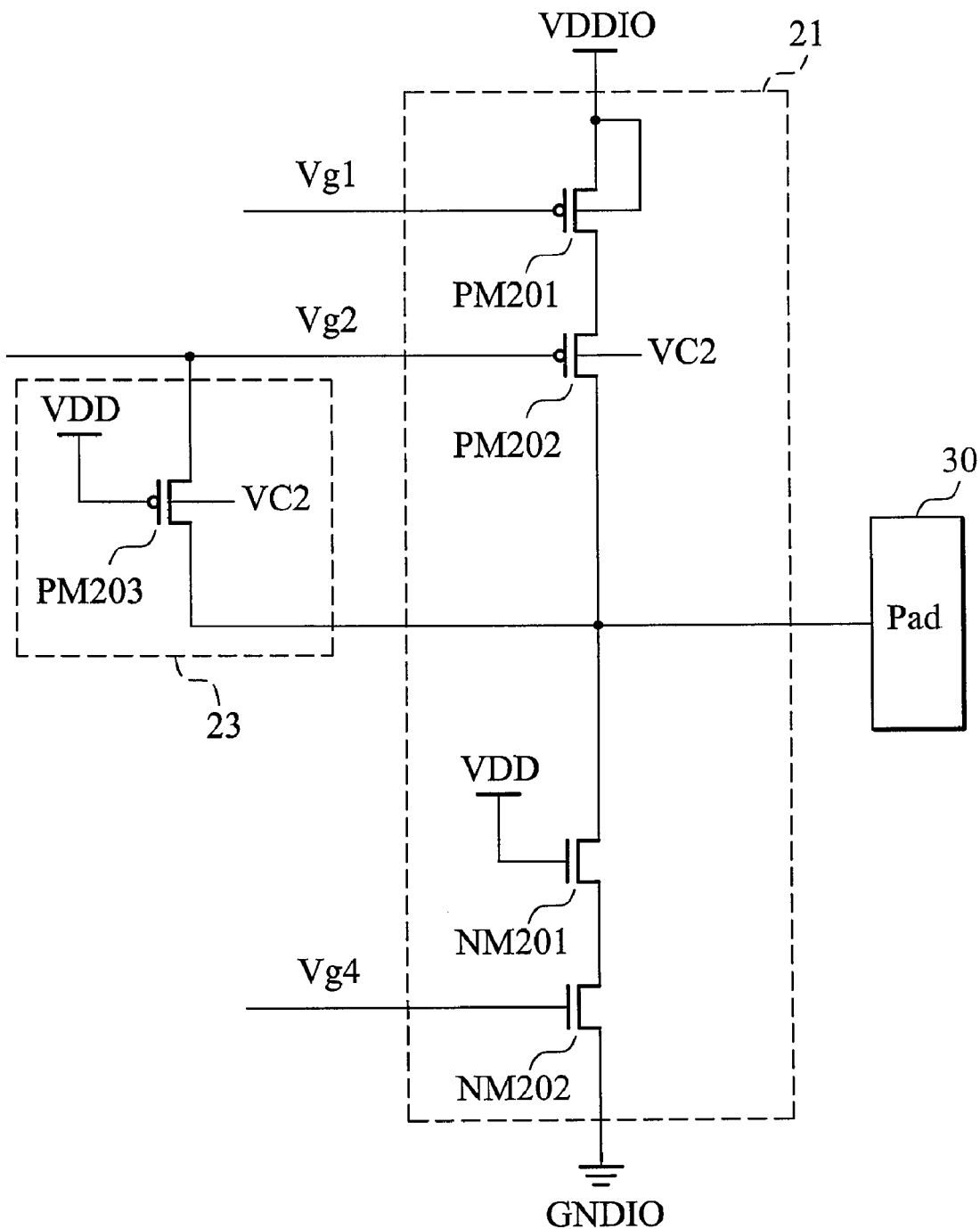
FIG. 3B is a schematic diagram of another exemplary embodiment of an output stage.

Additionally, stack P-type transistors and stack N-type transistors constitute the output stage 21 to maintain gate oxide reliability. FIG. 3B is a schematic diagram of another exemplary embodiment of an output stage. FIG. 3B is similar to FIG. 3A except for the addition of transistors PM202 and NM201. The transistor PM202 connects to the transistor NM201 in series between the transistors PM201 and NM202. The gate of the transistor PM202 receives the gate voltage Vg2. The gate of the transistor NM201 receives the operation voltage VDD. The-operation-voltage VDD approximately equals to 3.3V.

The gate voltage Vg2 is generated by the voltage level converter 22 for avoiding the higher voltage difference between the gate and the source of the transistor PM202. In this embodiment, when the supply voltage VDDIO is 5V, each of the gate voltages Vg1 and Vg2 exceeds 1.65V, but is not limited.

When the core circuit 20 desires to receive signal from the pad 30, the pre-driver 13 controls the voltage level converter 22 to generate the gate voltages Vg1 and Vg2. Thus, the transistors PM201 and PM202 are turned off due to the gate voltages Vg1 and Vg2. In this embodiment, when the gate voltage Vg1 equals to 5V and the gate voltage Vg2 exceeds 1.65V, the transistors PM201 and PM202 are turned off.

Additionally, the output cell 11 further comprises a gate-tracking circuit 23 as shown as in FIG. 2, such that the transistor of the output stage 21 does not generate leakage current. Referring to FIG. 3B, the gate-tracking circuit 23 is a transistor PM203. Since the gate-tracking circuit 23 is coupled between the gate and the drain of the transistor PM202, leakage current is not generated in the transistor PM202.

For example, when the pad 30 receives higher voltage (such as 5V), the transistor PM203 is turned on. Since the gate voltage and the drain voltage of the transistor PM202 are 5V, the transistor PM202 is turned off. Thus, leakage current is not generated in the transistor PM202. When the pad 30 receives lower voltage (such as 3.3V, 1.8V, or 0V), the transistor PM203 is turned off. At this time, the gate voltage Vg2 is determined by the voltage level converter 22.

Each of the transistors PM202 and PM203 receives voltage VC2 such that the PN junction of the transistor PM202 or PM203 is turned off for avoiding leakage current. In this embodiment, the voltage VC2 is generated by a floating well circuit 24 shown as in FIG. 2. In other embodiments, the floating well circuit 24 is omitted.

Figure 4:
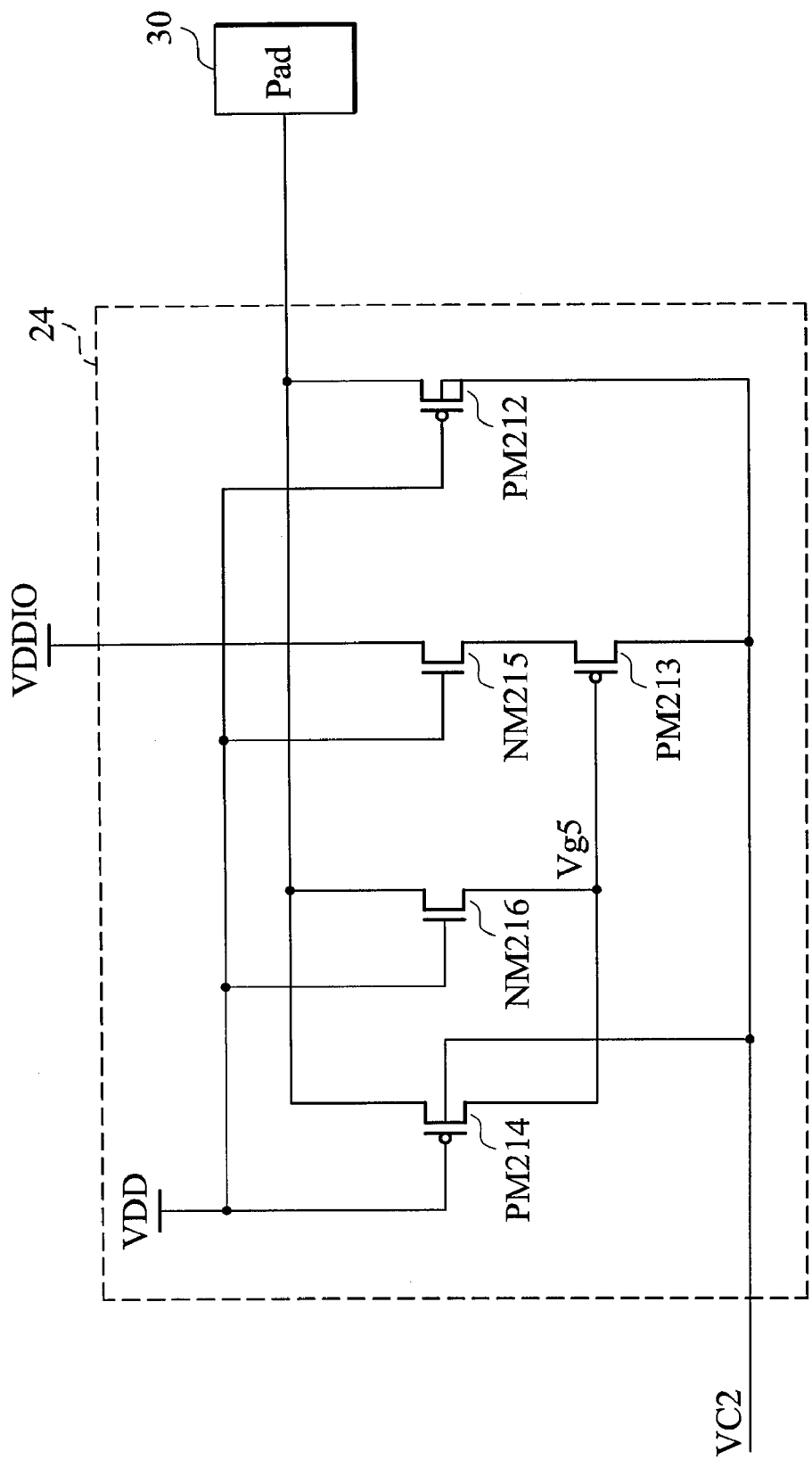
FIG. 4 is a schematic diagram of an exemplary embodiment of a floating well circuit.

FIG. 4 is a schematic diagram of an exemplary embodiment of a floating well circuit. When the voltage of the pad 30 is 5V and the supply voltage VDDIO is 5V, 3.3V, or 1.8V, the voltage VC2 equals to 5V. Since the voltage Vg5 equals to 5V, the transistors PM212 and PM214 are turned off and the transistor NM216 is turned of. Thus, the voltage VC2 is close to the supply voltage VDDIO. Similarly, when the voltage of the pad 30 is 1.8V and the supply voltage VDDIO equals to 5V or 3V, the voltage VC2 is close to the supply voltage VDDIO. At this time, all transistors of the floating well circuit 24 are turned off such that a body effect does not occur in the transistor PM202. Additionally, when the supply voltage VDDIO is 1.8V, since the base voltage of the transistor PM202 is 1.8V, the output driving function of the stack P-type transistor is increased and the transmission speed of the stack P-type transistor is also increased.

Figure 5:
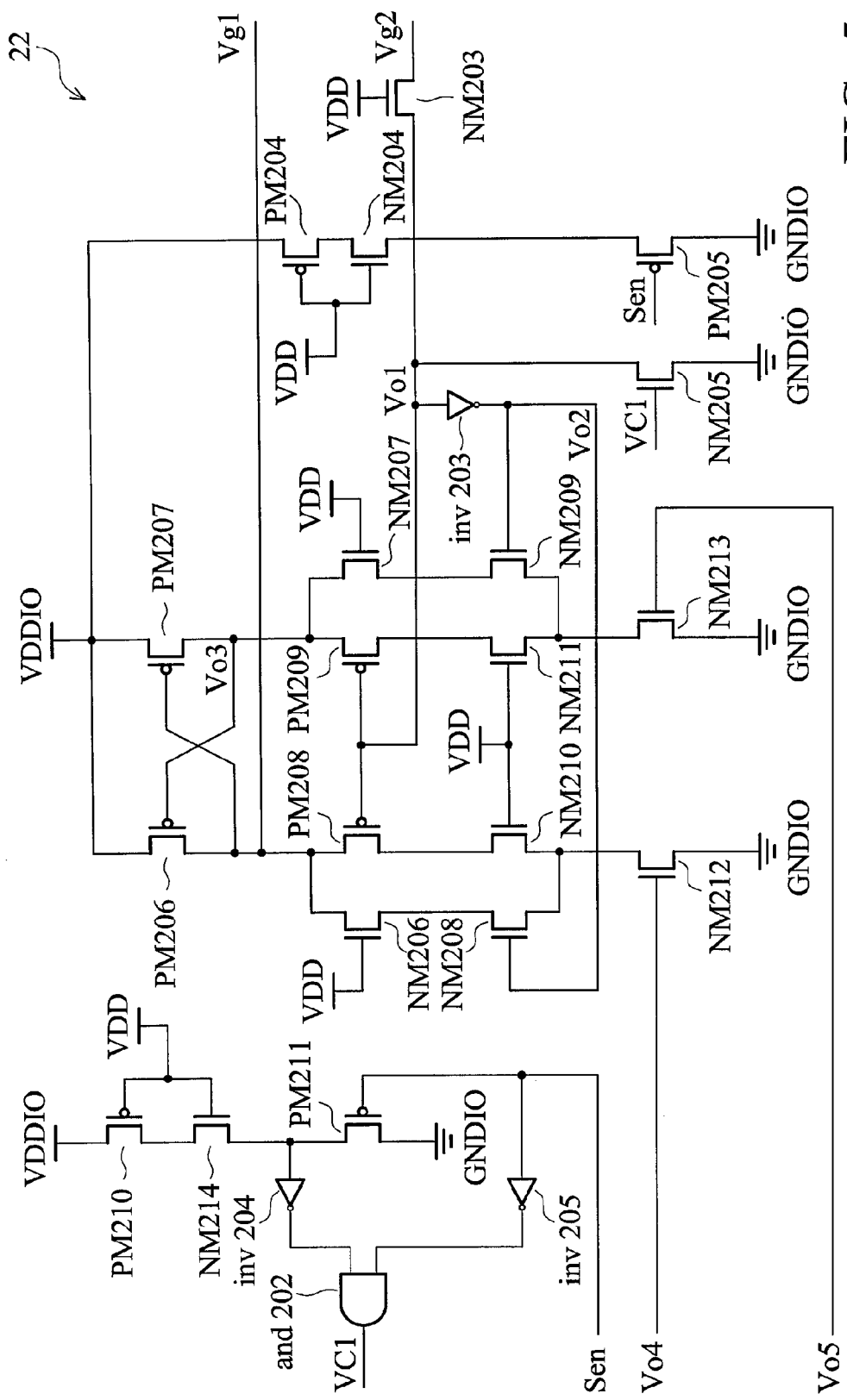
FIG. 5 is a schematic diagram of an exemplary embodiment of a voltage level converter.

FIG. 5 is a schematic diagram of an exemplary embodiment of a voltage level converter. The voltage level converter 22 provides appropriate gate voltages Vg1 and Vg2 to the transistors PM201 and PM202 of the output stage 21. Thus, the gate oxide reliability of the transistors PM201 and PM202 are maintained.

If the core circuit 20 desires to transmit the data signal Sd to the pad 30, the signal Sen is at the low level. Thus, the voltage VC1 is determined according to the output signal from the inverter inv204. When the supply voltage VDDIO is 5V, the input signal from the inverter inv204 is approximately 3.3V due to the transistors PM210 and NM214. At this time, the voltage VC1 is approximately 0V. Thus, the transistor NM205 is turned off. Since the signal Sen is 0V, the transistor PM205 is turned on. If the size of the transistors PM204, NM204, and PM205 are the same, the voltage Vo1 is approximately 1.67V (5V/3). Since the output voltage Vo2 is approximately 0V, the transistors NM208 and NM209 are turned off.

At this time, if the data signal Sd is at the low level, the voltage Vo4 is set at the low level. Since the transistor NM212 is turned off and the transistor NM213 is turned on, the voltage Vo3 is discharged via the transistor PM209.

If the threshold voltage of the transistor PM209 is approximately −0.8V, the voltage Vo3 is approximately 2.47V (1.67V+0.8V). When the supply voltage VDDIO is 5V, the gate voltage Vg1 approximately equals to the supply voltage VDDIO. Thus, the gate voltage Vg1 is 5V and the gate voltage Vg2 is 1.67V.

Referring to FIG. 3B, when the gate voltage Vg1 is 5V, the gate voltage Vg2 is 1.67V, and the gate voltage Vg4 is 3.3V, the pad 30 is at the low level. In other words, the data signal Sd provided by the core circuit 20 is transmitted to the pad 30. Furthermore, the output stage 21 receives the appropriate gate voltages Vg1 and Vg2 such that the gate oxide reliability is maintained.

If the data signal Sd is at the high level (such as 3.3V), the gate voltage Vg1 is approximately 2.47V. At this time, the gate voltage Vg4 is set to 0V. Thus, the pad 30 is at the high level. When the supply voltage VDDIO is 3.3V or 1.8V, the transistor PM210 is turned off. Thus, the voltage VC1 is 3.3V. Then, the voltage Vo1 and the gate voltage Vg2 are approximately 0V. At this time, the voltage Vo2 is 3.3V. Furthermore, since the transistors NM206 and NM208 are turned on, the gate voltage Vg1 approximately equals to 0V. When the gate voltages Vg1 and Vg2 are 0V, if the supply voltage VDDIO is 1.8V, the stack P-type transistors (such as PM201 and PM202) of the output stage 21 are turned on. If the data signal Sd is at the low level, the gate voltage Vg1 approximately equals to the supply voltage VDDIO. At this time, the pad 30 is at the low level.

Additionally, the transistor NM203 blocks the higher gate voltage Vg2, such as 5V. The voltages Vo4 and Vo5 received by the voltage level converter 22 are generated by the pre-driver 13.

Figure 6:
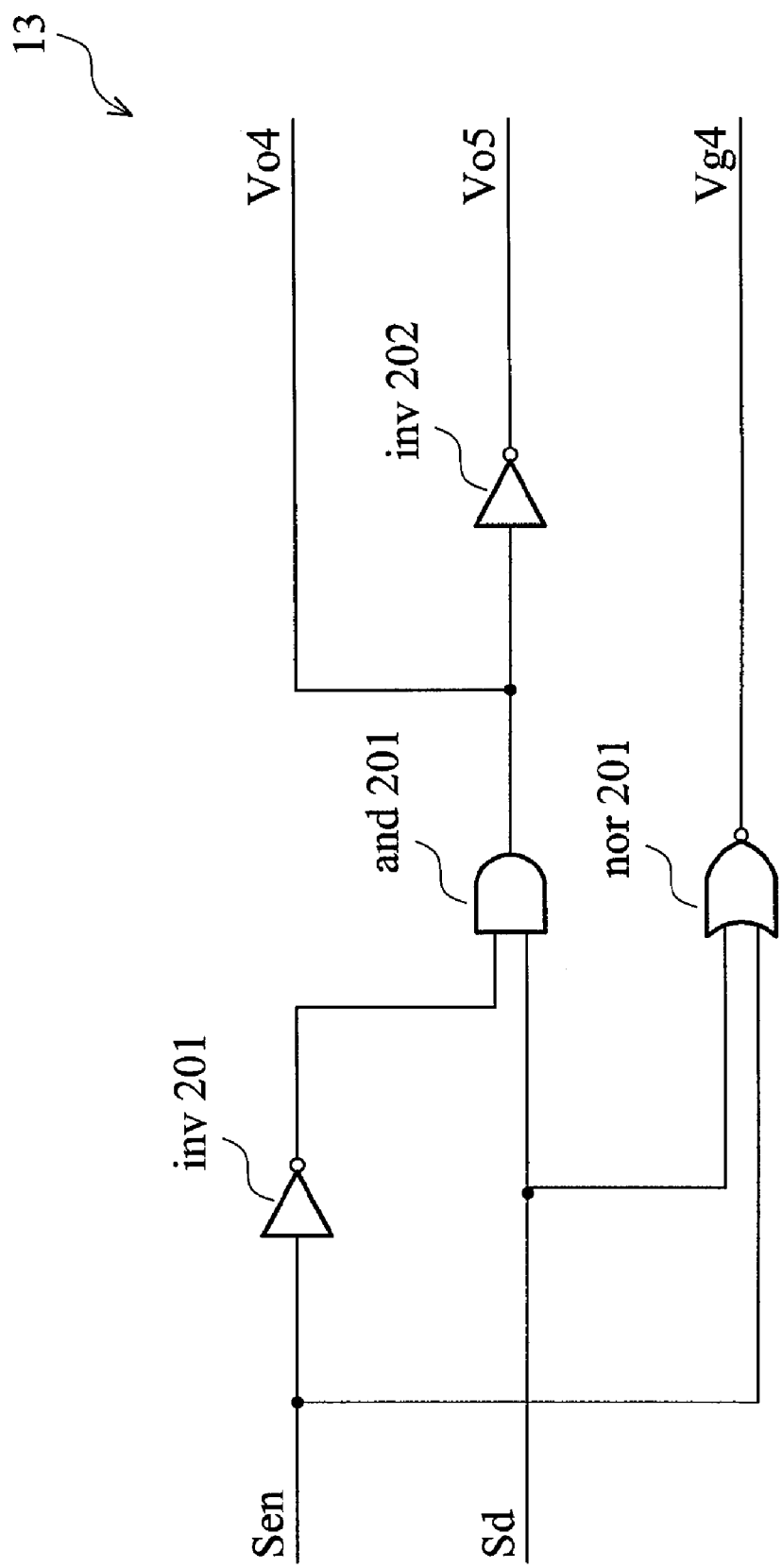
FIG. 6 is a schematic diagram of an exemplary embodiment of a pre-driver.

FIG. 6 is a schematic diagram of an exemplary: embodiment of a pre-driver. In this embodiment, the pre-driver 13 :comprises inverters inv201, inv202, an AND gate and201, and an NOR gate nor201, but is not limited. When the core circuit 12 desires to transmit the data signal Sd to the pad 30, the pre-driver 13 controls the voltage level converter 22 to generate the appropriate gate voltage according to the supply voltage VDDIO. If the structure of the output stage 21 is shown as in FIG. 3A, the voltage level converter 22 only generates a single gate voltage, such as Vg1. If the structure of the output stage 21 is shown as in FIG. 3B, the voltage level converter 22 generates two gate voltage, such as Vg1 and Vg2. Thus, the gate oxide reliability of the output stage 21 is maintained.

When the core circuit 20 desires to receive the signal from the pad 30, the pre-driver 13 de-activates the transistors of the output stage 21. Thus, the input cell 12 shown as in FIG. 1 transmits the signal from the pad 30 to the core circuit 20.

Figure 7:
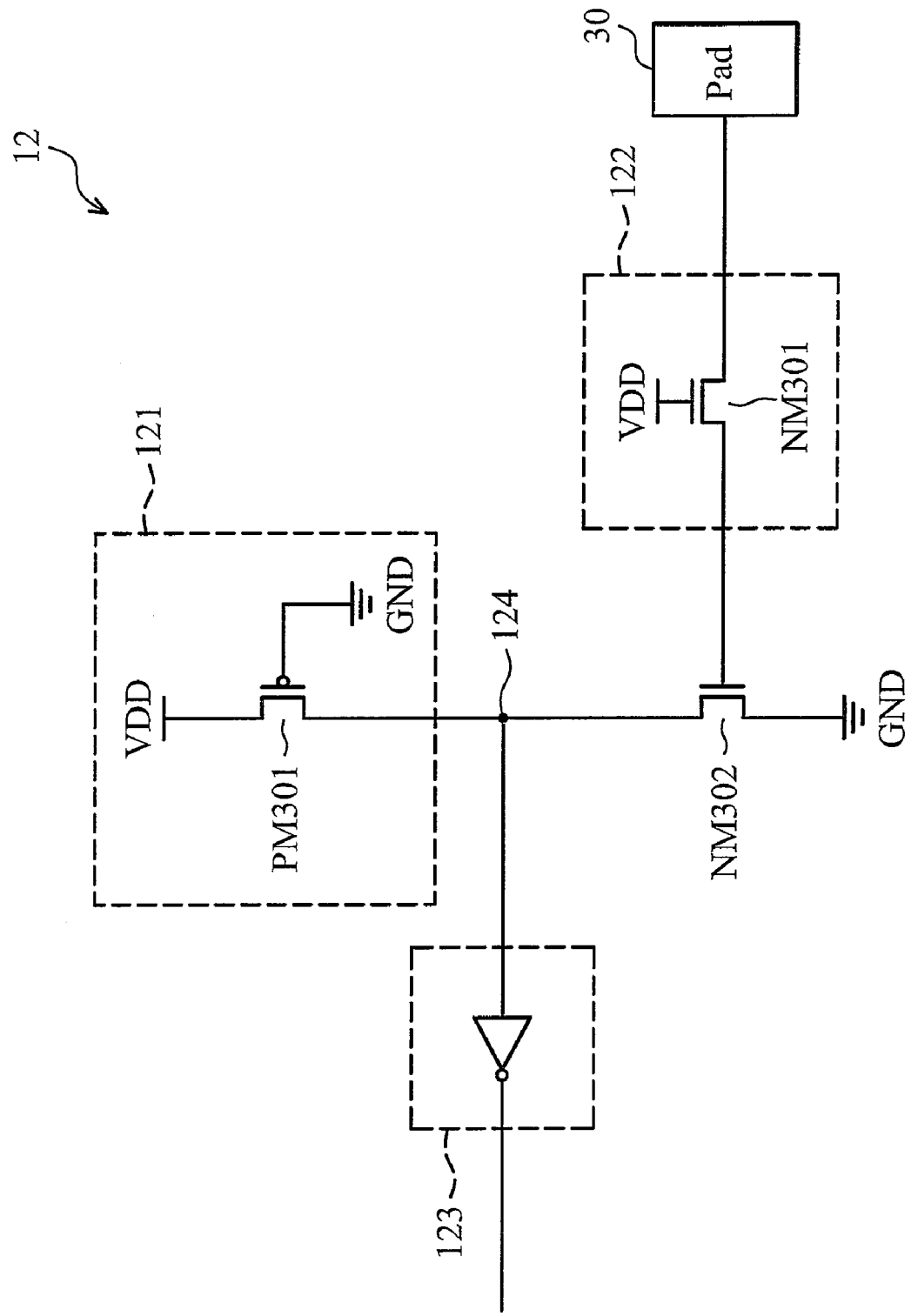
FIG. 7 is a schematic diagram of an exemplary embodiment of an input cell.

FIG. 7 is a schematic diagram of an exemplary embodiment of an input cell. The input cell 12 comprises a pull unit 121 and a transistor NM302. The pull unit 121 is coupled to a node 124 and receives an operation voltage VDD. When the transistor NM302 is turned off, the pull unit 121 sets the voltage of the node 124 to equal to !the operation voltage VDD. In this embodiment, the pull unit 121 is a P-type transistor PM301. The transistor PM301 comprises a gate receiving a grounding voltage GND, a source receiving the operation voltage VDD, and a drain coupled to the node 124. The operation voltage VDD may be 3.3V. The grounding voltage GND may be 0V.

In one embodiment, the gate of the transistor NM302 is directly coupled to the pad 30, the source thereof receives the grounding voltage GND, and the drain thereof is coupled to the node 124. When the transistor NM302 is turned on, the voltage of the node 124 approximately equals to the grounding voltage GND. In this embodiment, the gate of the transistor NM302 is coupled to the pad 30 via a high voltage block 122. The high voltage block 122 controls the voltage difference between the gate and the source of the transistor NM302. As shown in FIG. 7, the high voltage block 122 is a transistor NM301. The transistor NM301 comprises a gate receiving the operation voltage VDD, a source coupled to the gate of the transistor NM302, and a drain coupled to the node 124.

Additionally, the output cell 120 further comprises an inverter 123. The inverter 123 is coupled between the node 124 and the core circuit 20 for inversing the level of the node 124. In other embodiments, the inverter 123 is omitted. Thus, the level of the node 124 can be directly transmitted to the core circuit 20.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input cell coupled to a pad, comprising:
   an output stage comprising a first transistor and a second transistor, wherein the first transistor connects to the second transistor in serial between a first supply voltage and a second supply voltage, wherein the output stage further comprises a third transistor coupled between the first and the second transistors and coupled to the pad;
   a voltage level converter generating a first gate voltage to the first transistor according to the first supply voltage and a data signal, wherein when the first supply voltage is increased, the first gate voltage is increased and when the data signal is at a high level, the first transistor is turned on; and
   a floating well circuit controlling the base voltage of the third transistor.

2. The input cell as claimed in claim 1, wherein the voltage of the pad equals to the first supply voltage when the first transistor is turned on and the voltage of the pad equals to the second supply voltage when the second transistor is turned on.

3. The input cell as claimed in claim 1, further comprising a gate-tracking circuit, wherein the gate-tracking circuit controls the gate voltage of the third transistor to equal to the voltage of the pad when the voltage of the pad exceeds a preset value.

4. The input cell as claimed in claim 3, wherein the gate-tracking circuit is a fourth transistor and when the voltage of the pad exceeds the preset value, the fourth transistor is turned on.

5. The input cell as claimed in claim 4, wherein the floating well circuit controls the base voltage of the fourth transistor.

6. An output cell coupled between a pad and a core circuit, comprising:
   a pull unit coupled to a node and receiving an operation voltage, wherein the pull unit is a P-type transistor and the P-type transistor comprises a gate receiving the grounding voltage, a source receiving the operation voltage, and a drain coupled to the node;
   a first N-type transistor comprising a gate coupled to the pad, a source receiving a grounding voltage, and a drain coupled to the node; and
   a high-voltage block coupled between the pad and the first N-type transistor for controlling the voltage difference between the gate and the source of the first N-type transistor, wherein the high-voltage block is a second N-type transistor, the second N-type transistor comprises a gate receiving the operation voltage, a source coupled to the gate of the first N-type transistor, and a drain coupled to the pad.

7. The output cell as claimed in claim 6, further comprising an inverter coupled between the node and the core circuit for inverting the level of the node.

8. An input output device coupled between a core circuit and a pad, comprising:
   an output cell comprising:
      an output stage comprising a first transistor and a second transistor, wherein the first transistor connects to the second transistor in serial between a first supply voltage and a second supply voltage, wherein the output stage further comprises a third transistor coupled between the first and the second transistors and coupled to the pad, and wherein the output cell further comprises a floating well circuit controlling the base voltage of the third transistor; and a voltage level converter generating a first gate voltage to the first transistor according to the first supply voltage and a data signal, wherein when the first supply voltage is increased, the first gate voltage is increased and when the data signal is at a high level, the first transistor is turned on; and an input cell comprising:

a pull unit coupled to a node and receiving an operation voltage; and a first N-type transistor comprising a gate coupled to the pad, a source receiving a grounding voltage, and a drain coupled to the node; and a pre-driver turning off the first and the second transistors.

9. The input output device as claimed in claim 8, wherein the voltage of the pad enters the input cell when the first and the second transistors are turned off and the output cell transmits the first or the second voltage to the pad when each of the first and the second transistors is turned on.

10. The input output device as claimed in claim 8, wherein the voltage of the pad equals to the first supply voltage when the first supply transistor is turned on and the voltage of the pad equals to the second supply voltage when the second transistor is turned on.

11. The input output device as claimed in claim 8, wherein the output cell further comprises a gate-tracking circuit, and the gate-tracking circuit controls the gate voltage of the third transistor to equal to the voltage of the pad when the voltage of the pad exceeds a preset value.

12. The input output device as claimed in claim 11, wherein the gate-tracking circuit is a fourth transistor and when the voltage of the pad exceeds the preset value, the fourth transistor is turned on.

13. The input output device as claimed in claim 12, wherein the floating well circuit controls the base voltage of the fourth transistor.

14. The input output device as claimed in claim 8, wherein the pull unit is a P-type transistor and the P-type transistor comprises a gate receiving the grounding voltage, a source receiving the operation voltage, and a drain coupled to the node.

15. The input output device as claimed in claim 14, wherein the input cell further comprises:

a high-voltage block coupled between the pad and the first N-type transistor for controlling the voltage difference between the gate and the source of the first N-type transistor; and an inverter coupled between the node and the core circuit for inverting the level of the node.

16. The input output device as claimed in claim 15, wherein the high-voltage block is a second N-type transistor, the second N-type transistor comprises a gate receiving the operation voltage, a source coupled to the gate of the first N-type transistor, and a drain coupled to the pad.

* * * * *